(12) United States Patent
Wille et al.

(10) Patent No.: US 7,736,927 B2
(45) Date of Patent: Jun. 15, 2010

(54) METHOD FOR THE PRODUCTION OF AN ANTI-REFLECTING SURFACE ON OPTICAL INTEGRATED CIRCUITS

(75) Inventors: Holger Wille, Munich (DE); Gernot Langguth, Munich (DE); Karl-Heinz Mueller, Velden (DE)

(73) Assignee: Infineon Technologies AG, Munich (DE)

( * ) Notice: Subject to any disclaimer, the term of this patent is extended or adjusted under 35 U.S.C. 154(b) by 503 days.

(21) Appl. No.: 11/408,618

(22) Filed: Apr. 21, 2006

(65) Prior Publication Data

US 2006/0251995 A1 Nov. 9, 2006

(30) Foreign Application Priority Data

Oct. 29, 2003 (DE) ................. 103 50 643

(51) Int. Cl.
 *H01L 21/00* (2006.01)
(52) U.S. Cl. ............... 438/48; 438/81; 438/98; 257/458; 257/E31.061
(58) Field of Classification Search ........ 438/4, 438/184, 48, 81, 98; 257/458, 446, E31.061; 136/256; 430/321, 312
See application file for complete search history.

(56) References Cited

U.S. PATENT DOCUMENTS

| | | | | |
|---|---|---|---|---|
| 4,378,460 A | * | 3/1983 | Williams | ............ 136/256 |
| 4,625,225 A | * | 11/1986 | Goodfellow et al. | ........ 257/184 |
| 4,847,210 A | * | 7/1989 | Hwang et al. | ............ 438/59 |
| 5,410,175 A | * | 4/1995 | Kyomasu et al. | ........ 257/458 |
| 5,453,860 A | * | 9/1995 | Akiyama et al. | ............ 349/28 |
| 5,598,022 A | * | 1/1997 | Kyomasu | ............ 257/458 |
| 5,704,992 A | * | 1/1998 | Willeke et al. | ............ 136/255 |
| 6,075,275 A | * | 6/2000 | Irissou | ............ 257/458 |
| 6,147,297 A | * | 11/2000 | Wettling et al. | ............ 136/256 |
| 6,303,967 B1 | * | 10/2001 | Irissou | ............ 257/406 |
| 6,458,619 B1 | * | 10/2002 | Irissou | ............ 438/66 |
| 6,753,214 B1 | * | 6/2004 | Brinkmann et al. | ........ 438/184 |
| 2002/0000244 A1 | | 1/2002 | Zaidi | |
| 2003/0143774 A1 | * | 7/2003 | Takahashi et al. | ........ 438/69 |

FOREIGN PATENT DOCUMENTS

DE 29 52 431 A1 7/1981
DE 195 22 539 A1 1/1997

OTHER PUBLICATIONS

Green, M.A., "Silicon Solar Cells, Advanced Principles & Practice," published by Centre for Photovoltaic Devices and Systems, University of New South Wales, Sydney, Mar. 1995, pp. 206-213, 218-223.

* cited by examiner

*Primary Examiner*—Thanh V Pham
*Assistant Examiner*—Duy T Nguyen
(74) *Attorney, Agent, or Firm*—Slater & Matsil, L.L.P.

(57) ABSTRACT

A photodetector is formed in a semiconductor body. A hard mask grating is photolithographically formed on a surface of the semiconductor body. The semiconductor body is etched using the hard mask grating as a mask. The etching is performed down to a predetermined depth. An implantation is performed such that an anode or cathode of the photodetector that has been interrupted during the etching is re-formed.

25 Claims, 1 Drawing Sheet

METHOD FOR THE PRODUCTION OF AN ANTI-REFLECTING SURFACE ON OPTICAL INTEGRATED CIRCUITS

This application is a continuation of co-pending International Application No. PCT/DE2004/002340, filed Oct. 20, 2004, which designated the United States and was not published in English, and which is based on German Application No. 102 50 643.8, filed Oct. 29, 2003, both of which applications are incorporated herein by reference.

TECHNICAL FIELD

The invention relates to a method for the production of an anti-reflecting surface on optical integrated circuits in order to improve the absorption of light in photodetectors.

BACKGROUND

Photodetectors of this type, such as PIN photodiodes, comprise a cathode (n-region), an insulation (i-region) and an anode (p-region). This structure is produced on a substrate, for example a silicon substrate, by means of a first implantation, epitaxy and a second implantation.

In order to achieve good light absorption in a desired wavelength range, simple ARC layers (anti-reflecting coating) are deposited on the photodiode, or the integrated photodetectors. The disadvantage of these layers, however, is that they are optimized for a specific wavelength and are thus unsuitable for multispectral applications.

It is possible within limits to achieve a broadened absorption maximum by realizing a corresponding ARC layer construction through multiply deposited thin dielectric layers. However, this method has particular disadvantages in combination with the photodiode integrated into a chip technology.

In particular, the realization of multiple layers means that process costs are multiplied correspondingly in comparison with a single layer deposition. Moreover, this increases the throughput time in production, thereby causing an obstructive build-up at the respective coating installations (bottleneck effect). Moreover, it is difficult to realize the required accuracy of the layers to layer thicknesses of a few nanometers.

Furthermore, in semiconductor fabrication, the required refractive indices of light cannot be realized or are not available. In the case of ARC layers, in particular in the case of multilayers, a certain attenuation of the incident light is unavoidable.

In order to compensate for, or to avoid, this disadvantage and to be able to absorb as much light as possible, it is known to form patterned micropyramids on the surface of the photodetector. By virtue of these micropyramids, the absorption behavior becomes independent of the wavelength of the light radiated in. As a result, the light is also predominantly absorbed in the upper part of the photodetector, which has the consequence that the required epitaxial thickness can be reduced during the production of the photodetector.

Examples of ARC layers and micropyramids are described in "Silicon Solar Cells, Advanced Principles and Practice," Martin A. Green, published by the Centre for Photovoltaic Devices and Systems, University of New South Wales, Sydney, printed by Bridge Printery Pty. Ltd, March 1995.

These micropyramids on the surface of the photodetector may be realized by selective etching by uncovering the (111) crystal planes, thus giving rise to pyramids with square base areas. Furthermore, this document also describes the use of inverted pyramids (that is to say pyramids standing on their vertex) in order to improve the absorption of light in the photodetector. However, the production of inverted pyramids of this type is associated with a considerable complexity, so that this variant is not suitable for a practical application.

SUMMARY OF THE INVENTION

The invention is based on the object, then, of providing a method for the production of an anti-reflecting surface for optical integrated circuits that can be realized with little complexity and hence low costs and is compatible with IC and single device technologies.

The object on which the invention is based is achieved by virtue of the fact that a regular hard mask grating is produced photolithographically on the surface of the photodetector. A structure etching step is subsequently performed down to a predetermined depth into the silicon. The photodetector's anode or cathode that is interrupted during etching is re-established by a further implantation step.

The structure etching step is preferably performed by anisotropic, wet-chemical etching. It is also possible, however, that a dry etch can be taken into consideration.

The structure etching step produces depressions (trenches) having a depth of approximately 0.5 μm to 5 μm that are arranged in regularly distributed fashion and have acuter angles than pyramids with (111) faces, or preferably inverse pyramids.

The hard mask is furthermore patterned photolithographically in such a way that it has web widths of 0.5 μm and mesh openings having a width of 0.5 μm to 5 μm. The hard mask is preferably produced by $SiO_2$ deposition and subsequent photolithographic patterning.

BRIEF DESCRIPTION OF THE DRAWINGS

The invention will be explained in more detail below using an exemplary embodiment. In the associated figures of the drawing.

The following list of reference symbols can be used in conjunction with the figures:

1 Cathode
2 Insulation
3 Anode
4 Hard mask
5 Web
6 Mesh opening
7 Inverse pyramid

DETAILED DESCRIPTION OF ILLUSTRATIVE EMBODIMENTS

Figure 1:
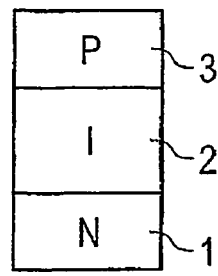
FIG. 1 shows a schematic illustration of a photodetector.
Figure 2:
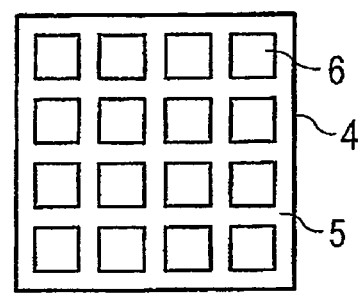
FIG. 2 shows a plan view of a hard mask produced photolithographically on the photodetector.

FIG. 1 shows the basic construction of a photodetector comprising a cathode 1 (n-region), an intrinsic region 2 (i-region) and an anode 3 (p-region) arranged thereabove. This structure is produced on a substrate, for example a silicon substrate, by arsenic implantation, epitaxy and boron implantation. This structure is part of a wafer that is large in areal terms and has been provided with a hard mask 4 by means of an $SiO_2$ deposition and subsequent photolithography. The hard mask 4 may be patterned by customary dry etching, thus giving rise to webs 5 having a width of 0.3 µm to 1 µm and mesh openings 6 having a width 0.5 µm to 5 µm (FIG. 2).

Figure 3:
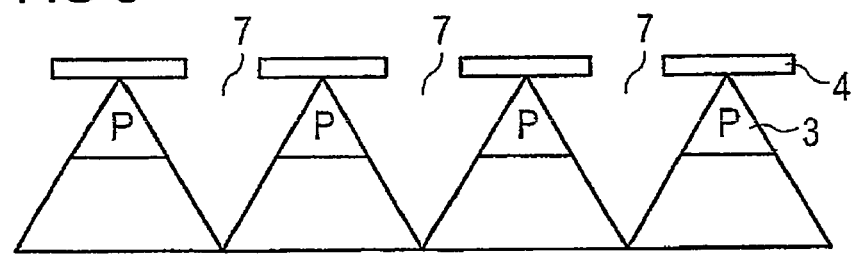
FIG. 3 shows the inverse pyramids produced according to the method according to the invention.

A structure etching step is subsequently performed, preferably by means of anisotropic, wet-chemical etching, and produces depressions (trenches) having a depth of approximately 1.5 µm that are arranged in regularly distributed fashion and have acuter angles than pyramids with (111) faces, or preferably inverse pyramids 7 (FIG. 3).

Since the anode 3 has been interrupted by the structure etching step, it is re-established by means of a concluding boron implantation and the photodetector is thus completed.

Figure 4:
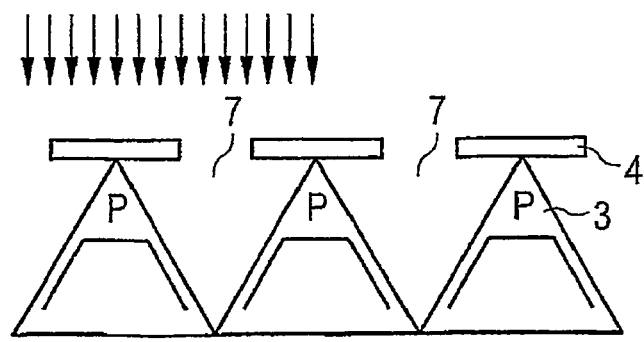
FIG. 4 shows a pyramid after the re-establishment of the anode interrupted by the preceding etching step.

Referring to FIG. 4, the photodetector thus formed comprises an intrinsic region (i-region) and the reestablished anode 3 (p-region) that surrounds at least a portion of the intrinsic region along its side and top surfaces.

As an alternative to the wet-chemical etch mentioned, it is also possible to perform a dry etch, thus giving rise to trenches (depressions) having straight walls. A significant improvement in the light absorption can already be achieved with trenches of this type instead of the inverse pyramids 7. Under specific etching conditions, preferably using a crystallographically anisotropically effective etching solution (e.g., choline, KOH), it is also possible to etch the inverse pyramids 7 into the surface of the silicon (FIG. 4).

This method is compatible with bipolar, CMOS or BiCMOS technology for integrated circuits and single devices. The pyramids produced by the method according to the invention form angles with respect to the perpendicularly incident light such that a large portion is absorbed by reflection and refraction independently of the wavelength in the silicon. The effective light path is lengthened as a result of the multiple refraction at the pyramids in comparison with perpendicular light incidence at planar surfaces.

The consequence is that the epitaxial thickness can be decreased, so that the installation costs and the throughput time are reduced. A further advantage is that the photodetector, with reduced dimensioning in the vertical direction, in particular the insulation thereof, can be shrunk in the lateral direction and can thus be produced more cost-effectively.

In the same way as with the application of standard anti-reflecting layers, the method according to the invention requires only one photolithography step and can thus be carried out inexpensively and rapidly.

What is claimed is:

1. A method of making a component, the method comprising:
   in a photodetector portion of a semiconductor body, forming three layers of material in the semiconductor body, said three layers of material comprising an I layer (intrinsic region) sandwiched between a top layer and a bottom layer, said top layer being either an n-region or a p-region and said bottom layer comprising the other one of said n-region or p-region;
   photolithographically forming a hard mask grating on a surface of the top layer of the three layers in the photodetector portion of the semiconductor body said hard mask grating formed subsequent to forming said three layers of material;
   forming a trench by etching through the top layer and into the I layer in the photodetector portion of the semiconductor body using the hard mask grating as a mask; and
   forming an anode/cathode region of a photodetector by implanting only into a sidewall of the trench with a dopant, the anode/cathode region being separated from the bottom layer by the I layer, wherein the anode/cathode region, the I layer, and the bottom layer form the photodetector.

2. The method as claimed in claim 1, wherein forming a trench by etching comprises anisotropic, wet-chemical etching.

3. The method as claimed in claim 1, wherein forming a trench by etching comprises etching recesses at least in the photodetector portion of the semiconductor body.

4. The method as claimed in claim 3, wherein the recesses have a depth of between about 0.5 µm to about 5 µm.

5. The method as claimed in claim 3, wherein the recesses are arranged in a regularly distributed fashion as determined by the hard mask grating.

6. The method as claimed in claim 1, wherein the trench has an angle more acute than a pyramid with (111) faces.

7. The method as claimed in claim 1, wherein photolithographically forming the hard mask comprises forming a grating having a web of exposed regions surrounding plates of the photodetector.

8. The method as claimed in claim 7, wherein the web of exposed regions have a width of about 0.5 µm.

9. The method as claimed in claim 8, wherein the plates have a width between about 0.5 µm and about 5 µm.

10. The method as claimed in claim 1, wherein photolithographically forming the hard mask grating comprises depositing an oxide and subsequently photolithographically patterning the oxide.

11. The method as claimed in claim 10, wherein the oxide comprises SiO2.

12. A method for the production of an anti-reflecting surface on a photodetector, said photodetector comprising an I layer (intrinsic region) sandwiched between a top layer and a bottom layer, said top layer having a p-type doping and said bottom layer having an n-type doping, the method comprising:
   photolithographically producing a regular hard mask grating on a top surface of the top layer;
   forming a trench by etching down to a predetermined depth through the top layer and into the I layer; and
   forming an anode of the photodetector by lining sidewalls of the trench by implanting dopants only into the sidewalls of the trench, wherein the bottom layer forms the cathode of the photodetector.

13. The method as claimed in claim 12, wherein the forming a trench by etching step is performed by anisotropic, wet-chemical etching.

14. The method as claimed in claim 12, wherein the trench has a depth of approximately 0.5 µm to 5 µm.

15. The method as claimed in claim 12, wherein the trench has an angle more acute than a pyramid with (111) faces.

16. The method as claimed in claim 12, wherein the hard mask is patterned photolithographically in such a way that it has web widths of approximately 0.5 µm and mesh openings having a width of 0.5 µm to 5 µm.

17. The method as claimed in claim 12, wherein the hard mask is produced by SiO2 deposition and subsequent photolithographic patterning.

18. A method of making a photodetector, the method comprising:
   forming a first semiconductor region of an N conductivity type;
   forming a second semiconductor region over the first semiconductor region, the second semiconductor region comprising an intrinsic region;
   forming a third semiconductor region having a P conductivity type over the second semiconductor region;
   forming a hard mask layer on a top surface of the third semiconductor region;

patterning the hard mask layer to expose a series of crossing strips of the third semiconductor region;

forming a trench by isotropically etching the exposed series of crossing strips through the third semiconductor region and into the second semiconductor region; and implanting only sidewalls of the trench to extend the P conductivity type of the third semiconductor material into the intrinsic region to form an anode region of the photodetector, wherein said anode region, a cathode region comprising said first semiconductor region, and said second semiconductor region form the photodetector.

19. The method of claim 18, wherein forming a trench comprises etching through the third semiconductor region and into the second semiconductor region to form pyramid-shaped semiconductor bodies and wherein performing an implantation step comprises implanting a dopant of the second conductivity type into an upper surface of the second semiconductor region.

20. The method of claim 18, wherein:

forming a first semiconductor region comprises implanting dopants into a semiconductor body;

forming a second semiconductor region comprises epitaxially growing a semiconductor layer over the first semiconductor region; and forming a third semiconductor region comprises implanting dopants into an upper portion of the epitaxially grown semiconductor layer.

21. The method of claim 1, wherein forming a trench comprises forming pyramidal shaped regions in the semiconductor body, the hard mask grating being disposed on the apex of the pyramidal shaped regions.

22. The method of claim 3, wherein the recesses extend under the hard mask grating.

23. The method of claim 6, wherein the trenches extend under the hard mask grating.

24. The method of claim 12, wherein the anti-reflecting surface improves the absorption of light at the photodetector.

25. A method of making a photodetector, the method comprising:

forming a first semiconductor region of one of a first conductivity type;

forming a second semiconductor region over the first semiconductor region, the second semiconductor region comprising an intrinsic region;

forming a third semiconductor region having a second conductivity type over the second semiconductor region, the second conductivity type being opposite to the first conductivity type;

forming a hard mask layer on a top surface of the third semiconductor region;

patterning the hard mask layer to expose a portion of the third semiconductor region;

forming a trench by etching the exposed third semiconductor region and into the second semiconductor region; and after etching, implanting a dopant of the second conductivity type only into sidewalls of the trench to form an anode or cathode of the photodetector, wherein said anode or cathode and said first and second semiconductor regions form the photodetector, wherein the anode or cathode region surrounds at least a portion of the second semiconductor region along side and top surfaces of the second semiconductor region.

* * * * *